United States Patent [19]

Cooke

[11] 3,753,056

[45] Aug. 14, 1973

[54] MICROWAVE SEMICONDUCTOR DEVICE

[75] Inventor: Harry F. Cooke, Dallas, Tex.

[73] Assignee: Texas Instruments Incorporated, Dallas, Tex.

[22] Filed: Mar. 22, 1971

[21] Appl. No.: 126,885

Related U.S. Application Data

[63] Continuation of Ser. No. 787,928, Dec. 30, 1968, abandoned.

[52] U.S. Cl. .... 317/234 R, 317/234 G, 317/234 M, 317/234 N

[51] Int. Cl. .......... H01l 5/00

[58] Field of Search .......... 317/234 317/5.3, 317/5.4, 317/4

[56] References Cited

UNITED STATES PATENTS

| | | | |
|---|---|---|---|
| 3,370,204 | 2/1968 | Cave | 317/101 |
| 3,489,956 | 1/1970 | Yanai et al. | 317/234 |
| 3,486,082 | 12/1969 | Sakamoto | 317/234 |
| 3,509,434 | 4/1970 | Yanai et al. | 317/235 |
| 3,364,400 | 1/1968 | Granberry | 317/235 |
| 3,626,259 | 12/1971 | Garboushian | 317/234 |

*Primary Examiner*—John W. Huckert
*Assistant Examiner*—E. Wojciechowicz
*Attorney*—Gary C. Honeycutt

[57] ABSTRACT

Semiconductor devices, such as transistors or diodes, which dissipate appreciable heat, may be mounted on an insert having high thermal conductivity in a discrete component configuration. This insert of high thermal conductivity, such as beryllia, is embedded in a disc of copper or other material having a high thermal conductivity and good electrical conductivity. The disc, with the insert embedded therein, may then be mounted in a microwave circuit formed on a dielectric substrate. Strip line jumpers are bonded to the microwave circuit on the dielectric substrate and to the active elements of the semiconductor device for med on the insert. The disc is embedded in the substrate in a manner to be in electrical contact with a ground plane thereon so that the heat generated by the semiconductor device will be dissipated by the ground plane.

4 Claims, 6 Drawing Figures

INVENTOR
HARRY F. COOKE
by Henry T. Olsen
His Attorney

INVENTOR
HARRY F. COOKE by Henry T. Olsen
His Attorney

MICROWAVE SEMICONDUCTOR DEVICE

This application is a continuation of Ser. No. 787,928, filed Dec. 30, 1968, abandoned.

This invention relates to semiconductor devices, and more particularly to microwave semiconductor devices in a discrete component configuration for dissipation of appreciable heat.

Micro miniaturization of microwave circuits has been made possible by the use of strip lines formed on a dielectric substrate. To gain full advantage of micro miniaturization, the active elements of a microwave circuit should be formed on the substrate. Unfortunately, when devices such as transistors or diodes, which dissipate appreciable heat, are mounted on a ceramic (e.g., glazed alumina) the temperature of the device may rise high enough to cause permanent damage thereto. Since alumina $Al_2O_3$), particularly the glazed type, has a low thermal conductivity, heat cannot flow away from the device as fast as it is generated. Consequently, complete miniaturization of microwave power circuits has heretofore been impractical.

An object of the present invention is to provide a semiconductor device for operation at microwave frequencies, and at relatively high power levels. Another object of this invention is to provide a semiconductor device on an insert having high thermal conductivity. A further object of this invention is to provide a semiconductor device on an insert of high thermal conductivity embedded in a dielectric substrate. Still another object of this invention is to provide a semiconductor device on a beryllia insert embedded in an alumina substrate and connected to a microwave strip line circuit. Another object of this invention is to provide a low common lead induction terminal for a semiconductor device.

In accordance with the present invention, a microwave semiconductor power device is formed on an insert having high thermal conductivity. This insert is embedded in the ceramic substrate to thereby provide means for carrying away heat generated by the semiconductor device. The insert may be in thermal contact with a ground plane or any other medium which acts as a heat sink.

In accordance with a specific embodiment of this invention, an insert of beryllia is embedded in a copper disc which in turn is embedded in an alumina substrate in electrical and mechanical contact with a circuit ground plane. One surface of the beryllia insert is flush with one surface of the copper disc which mounts flush with the alumina substrate. A semiconductor device formed on the beryllia insert is coupled to strip lines on the alumina substrate by means of strip line jumpers bonded to the circuit strip lines and the semiconductor device. If the semiconductor device on the beryllia insert is a transistor, the collector electrode thereof may be connected to one strip line, the emitter electrode may be connected to another strip line, and the base electrode may be connected to the copper disc. Since the copper disc is in thermal and electrical contact with the circuit ground plane, such a transistor operates in a grounded base configuration.

A more complete understanding of the invention and its advantages will be gained from the specification and claims and from the accompanying drawings illustrative of the invention.

Referring to the drawings.

Figures 1, 2:
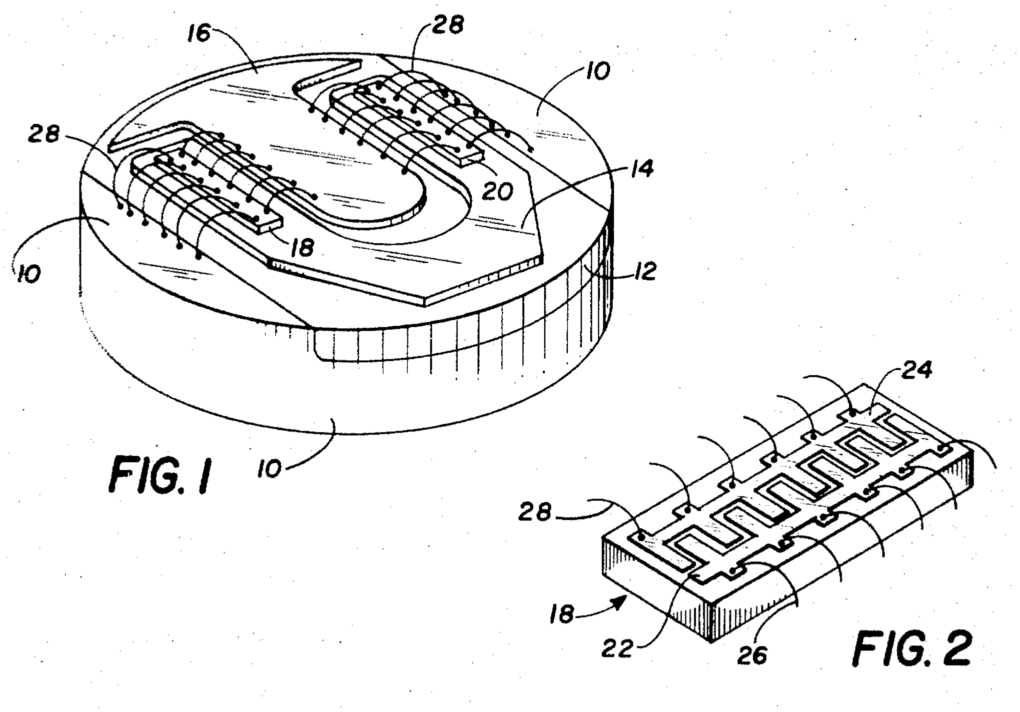
FIG. 1 is an isometric view of an insert having high thermal conductivity embedded in a disc having high thermal conductivity and good electrical conductivity.
FIG. 2 is an isometric view of a microwave frequency transistor of the type mounted on the insert of FIG. 1.

Referring to FIG. 1, there is shown a disc 10 of a material, such as copper, having a high thermal conductivity and good electrical conducivity. An insert 12 of a material, such as beryllium oxide (beryllia), having a high thermal conductivity and low electrical conductivity, is embedded in the disc 10. Materials other than copper, of course, may be used for the disc 10. In addition to beryllium oxide, silicon carbide and diamond may also be used as the insert material. Other materials having a high thermal conductivity and low electrical conductivity may also be used for the insert 12. As a guide for selecting the insert material, beryllia has a thermal conductivity on the order of 0.56 cal/-sec/cm²/°C/cm, and an electrical conductivity on the order of alumina. Silicon carbide has a thermal conductivity on the order of 0.40 and diamond on the order of 0.95. Thus, a wide range of materials may be used for the insert 12.

Beryllia is a preferred material for the insert 12 because it has moderate cost, a relatively high thermal conductivity, and a low electrical conductivity. It would be a desirable substrate material for a complete microwave circuit except that it is difficult to tool due to its toxidity in a finely divided form.

To avoid the need for machining or otherwise tooling the insert 12, only simple forms are used which may be fabricated by a manufacturer equipped to handle such materials. By using only small inserts, the costs are kept reasonably low. Considerations as to machineability and costs would also limit the use of silicon carbide and diamond to small, preformed designs.

Two strip lines 14 and 16 are formed on the upper surface of the insert 12 by any standard vapor deposition or metallizing technique. Gold has developed to be a preferred material for strip lines of microwave circuitry.

Bonded to the strip line 14 are transistors 18 and 20. These transistors are fabricated on a silicon block, as illustrated in FIG. 2, with a collector electrode, an emitter electrode, and a base electrode formed by appropriate techniques. As illustrated in FIG. 2, the emitter region 22 and the base region 24 are formed in a pattern of interdigitated fingers. The emitter regions of the transistors 18 and 20 are connected to the strip line 16 by means of wires 26, one connected to each finger. Similarly, the fingers of the base region of the transistors 18 and 20 are connectd to the disc 10 by means of wires 28.

Although transistors have been illustrated in FIG. 1, it should be understood that other semiconductor devices, such as diodes, may be formed on the insert 12. In fact, any microwave circuit component dissipating appreciable heat may be insert mounted. The function of the insert 12 is to provide an insulating base having a high thermal conductivity on which said circuit components may be formed. Since the insert 12 has a high thermal conductivity, heat generated by the elements formed thereon will be transferred to the disc 10.

Figure 3:
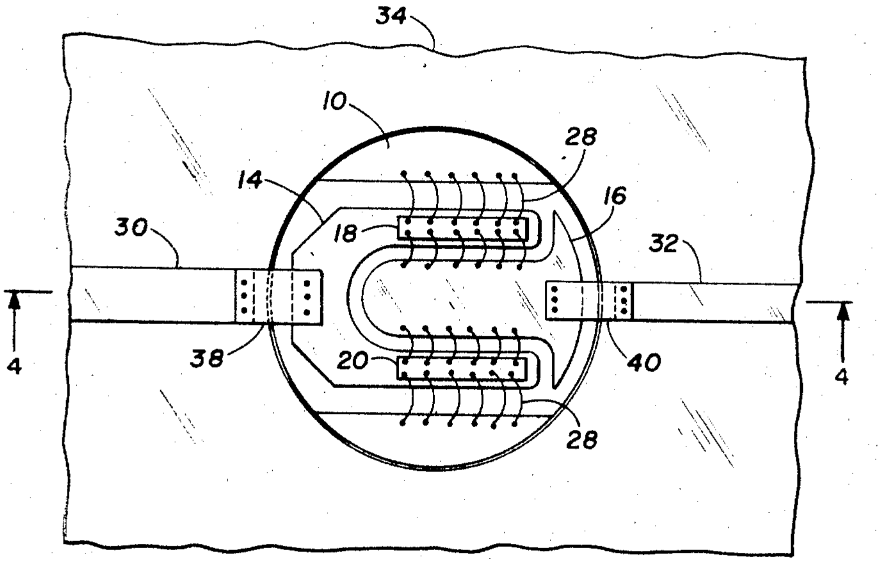
FIG. 3 is a plan view of a section of a microwave circuit including the disc of FIG. 1.
Figure 4:
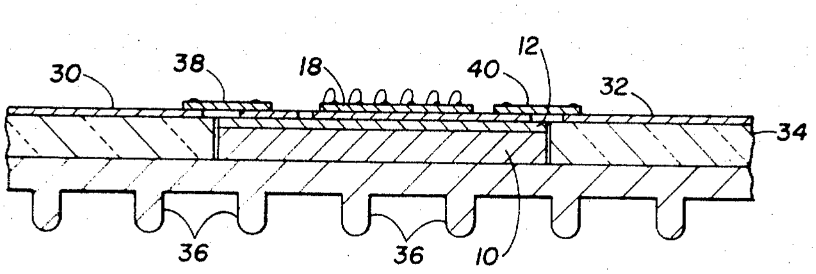
FIG. 4 is a sectional view of FIG. 3 taken along the line 4—4.

The disc 10, insert 12, strip lines 14 and 16, and the transistors 18 and 20 form a discrete semiconductor component which may be coupled to a microwave circuit. Preferably, the structure of FIG. 1 will be bonded to a microwave circuit after being embedded in a dielectric substrate, as illustrated in FIG. 3. Referring to FIG. 3, there is shown one portion of a microwave circuit which may include numerous strip lines and associated resistor, capacitor, and inductor couplings. Only strip lines 30 and 32 are shown formed on a dielectric substrate 34. An opening is cut in the substrate 34 to a ground plane 36 as illustrated in FIG. 4. The structure of FIG. 1 is inserted into the opening with the disc 10 in a metal-to-metal contact with the ground plane 36. The disc 10 may then be brazed or soldered to the ground plane 36 to form a mechanical connection therewith. It is also understood that the insert 12 could be of the same thickness as the substrate 34, and that the disc 10 be set into a depression in the ground plane 36.

With the structure of FIG. 1, thus assembled, the upper surface of the insert 12 will be flush with the upper surface of the substrate 34. The active elements of the transistors 18 and 20 are connected to the strip lines 30 and 32 by means of strip line jumpers 38 and 40, respectively. The jumpers 38 and 40 are bonded or welded to the lines 30 and 32 and to the lines 14 and 16.

To conduct the heat generated by active elements on the insert 12 to the ground plane 36, it is essential that a high thermal conductive path exist between the active element and the ground plane. A high thermal conductive path is provided by metallizing the lower surface and also, but not necessarily, the two edges of the insert 12 prior to embedding in the disc 10. The insert is then brazed (preferably) or soldered to the disc 10 which, as explained, is brazed or soldered to the ground plane 36. Thus, a high thermal conductive path is provided from the transistors 18 and 20 to the ground plane 36.

Figure 5:
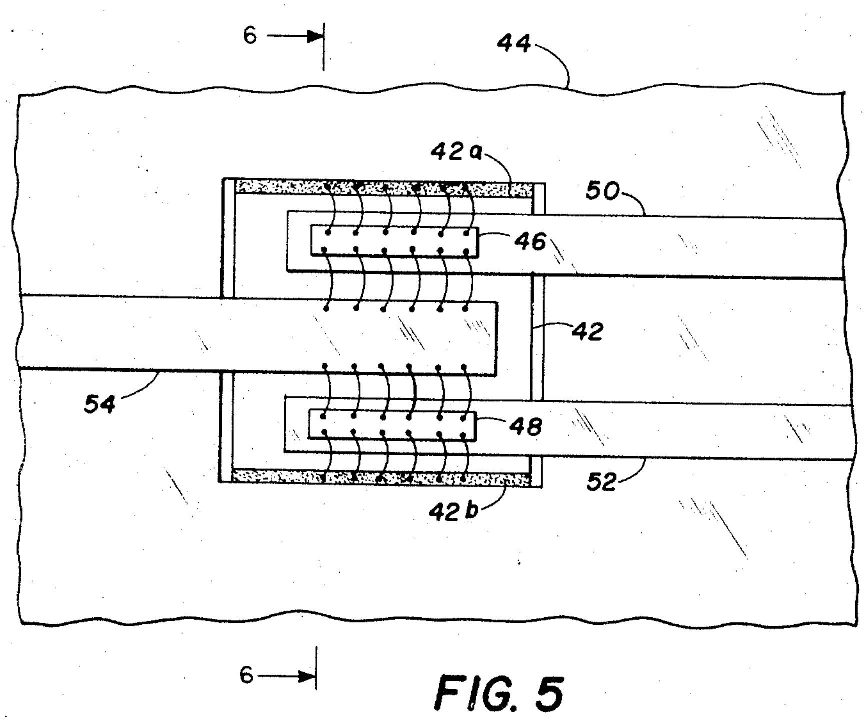
FIG. 5 is a plan view of an alternate embodiment of the insert of the present invention embedded in an alumina substrate.
Figure 6:
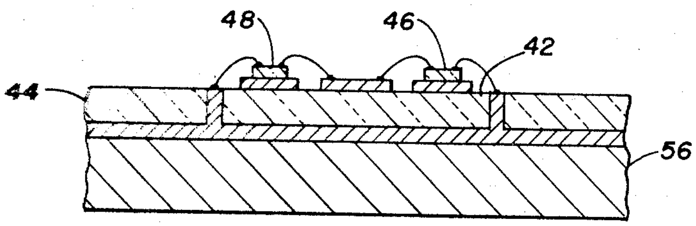
FIG. 6 is a sectional view of FIG. 5 taken along the line 6—6.

As an alternate, an insert having high thermal conductivity and dielectric characteristics may be inserted into an opening on the dielectric substrate in contact with a ground plane as illustrated in FIGS. 5 and 6. A square insert 42 is inserted in an opening in a dielectric substrate 44 such as $Al_2O_3$. The sides 42a and 42b and the bottom of the insert 42 are metallized prior to assembly in the substrate. Transistors 46 and 48 are mounted on strip lines 50 and 52 that have previously been vapor deposited on the substrate 44 and the insert 42. Transistors 46 and 48 may be similar to those illustrated in FIG. 2, and as such are connected to the metallized sides **42*a* and 42*b* and a strip line 54 that has also been vapor deposited on the substrate 44 over the insert 42. In this embodiment, the metallized sides 42*a* and 42*b* act as a conductor to a ground plane 56** for electrical connection of the transistor to the ground plane.

To construct a microwave circuit using the insert of FIGS. 5 and 6, rectangles of beryllia or other insert material are cut to size sufficient to hold a particular semiconductor device. The sides **42*a* and 42*b* and the bottom of the insert 42 are metallized and brazed (preferably) or soldered to the ground plane 56, which may be a copper sheet. Openings are formed in the dielectric substrate 44 and it is assembled over the insert. Using preforms, the dielectric substrate 44 is brazed or soldered to the metallized edges 42*a* and 42*b*. The surface of the braze 42*a*, 42*b* may also be used as a low inductance connection for the common terminal of the transistors 18 and 20. For additional strength, it may be desirable to braze or solder the substrate 44 to the ground plane 56 at several other points. The gap left between the unmetallized sides of the insert 42 can be filled with a suitable filler of either a ceramic or organic paste. With the insert 42 and the substrate 44 assembled to the ground plane 56,** the upper surfaces of the insert and the substrate are flush and present a smooth continuous surface.

At this point, thin film circuitry such as strip lines 50, 52, and 54 are formed on the substrate 44 by any one of many well known techniques. The various semiconductor devices, such as transistors 46 and 48, are next mounted on the strip lines and electrically connected to other strip lines and the ground plane 56.

While several embodiments of the invention, together with modifications thereof, have been described in detail herein and shown in the accompanying drawings, it will be evident that various further modifications are possible without departing from the scope of the invention.

What is claimed is:

1. A semiconductor structure comprising:

a. a ground plane which serves as a heat sink for the dissipation of heat created by an active semiconductor device;

b. a dielectric substrate secured to a surface of said ground plane, said dielectric substrate having an opening therein which exposes a region of said ground plane;

c. a body having good thermal and electrical conductivity, said body being selectively located in said opening and secured to said ground plane;

d. an insert selectively located in one surface of said body, said insert having high thermal conductivity and low electrical conductivity;

e. at least one strip line secured to said insert;

f. at least one active semiconductor device secured to said at least one strip line, thereby providing a thermally conductive and electrically insulative path to said ground plane;

g. a plurality of strip lines secured to said substrate; and h. means for coupling said at least one active semiconductor device to said plurality of strip lines.

2. The microwave semiconductor structure of claim 1 wherein there is a first strip line and a second strip line secured to said substrate and at least one transistor secured to said at least one strip line, and wherein the base of the transistor is electrically coupled to said first strip line, the emitter of the transistor is electrically coupled to said body thereby providing an electrical connection to said ground plane, and the collector of the transistor is electrically coupled to said second strip line and thermally and electrically coupled to said at least one strip line on said insert whereby said collector is electrically insulated from but thermally connected to said ground plane.

3. A semiconductor structure comprising:

a. a ground plane which serves as a heat sink for the dissipation of heat created by an active semiconductor device;

b. a dielectric substrate secured to said ground plane, said dielectric substrate having an opening therein exposing said ground plane;

c. an insert selectively located in said opening and secured to said ground plane and spaced from said substrate, said insert being thermally conductive and electrically insulative;

d. metallization in at least one selective region between said insert and said substrate, said metallization electrically contacting said ground plane;

e. at least one strip line secured to said substrate and to said insert, said strip line being selectively located to extend across a gap region where said substrate and said insert are spaced apart; and f. an active semiconductor device secured to said strip line, thereby providing a thermally conductive and electrically insulative path to said ground plane.

4. The microwave semiconductor structure of claim 3 wherein there is a first strip line and a second strip line and said active semiconductor device is a transistor having a base electrically coupled to said first strip line, an emitter electrically coupled to said metallization thereby having electrical connection to said ground plane, and a collector electrically and thermally coupled to said second strip line thereby being thermally connected to and electrically insulated from said ground plane.

* * * * *